(12) United States Patent
Sekiya

(10) Patent No.: US 7,687,373 B2
(45) Date of Patent: Mar. 30, 2010

(54) WAFER DIVIDING METHOD AND APPARATUS

(75) Inventor: Kazuma Sekiya, Ota-ku (JP)

(73) Assignee: Disco Corporation, Tokyo (JP)

( * ) Notice: Subject to any disclaimer, the term of this patent is extended or adjusted under 35 U.S.C. 154(b) by 5 days.

(21) Appl. No.: 11/975,404

(22) Filed: Oct. 19, 2007

(65) Prior Publication Data
US 2008/0102606 A1 May 1, 2008

(30) Foreign Application Priority Data
Oct. 27, 2006 (JP) .............................. 2006-292336

(51) Int. Cl.
*H01L 21/00* (2006.01)
(52) U.S. Cl. ............................... 438/460; 257/E21.238
(58) Field of Classification Search ................. 438/113, 438/460; 257/E21.238
See application file for complete search history.

(56) References Cited

U.S. PATENT DOCUMENTS

2003/0224540 A1* 12/2003 Watanabe et al. .............. 438/7
2005/0064683 A1* 3/2005 Farnworth et al. .......... 438/464
2005/0170616 A1* 8/2005 Murata et al. ............... 438/463

FOREIGN PATENT DOCUMENTS

JP 06-242041 * 9/1994
JP 2004-022936 1/2004

* cited by examiner

*Primary Examiner*—W. David Coleman
(74) *Attorney, Agent, or Firm*—Greer, Burns & Crain, Ltd.

(57) ABSTRACT

In the case of cutting streets on the rear surface of a wafer by laser beam irradiation, even if the wafer is variously doped or thermally-treated, the streets of a wafer front surface can accurately be detected and cut. Infrared light is emitted from an infrared light source to the front surface side of the wafer to penetrate the wafer. The penetrating image is captured by an infrared microscope disposed on the rear surface side of the wafer. The streets are detected by the image pattern of a wafer front surface captured. A laser beam is emitted from a laser head to the wafer rear surface along the streets detected, thus processing the streets for cutting.

4 Claims, 6 Drawing Sheets

WAFER DIVIDING METHOD AND APPARATUS

BACKGROUND OF THE INVENTION

1. Field of the Invention

The present invention relates to a method and apparatus suitable to divide a semiconductor wafer into a large number of semiconductor devices by laser beam irradiation. In particular the invention relates to a technique for laser beam irradiation on the rear surface side of a semiconductor wafer not formed with devices.

2. Description of the Related Art

A wafer formed with a large number of semiconductor devices on the front surface thereof is thinned to a required thickness by grinding the rear surface thereof. Thereafter, the wafer is stuck to a dicing tape with a dicing frame and cut along cut lines called streets between the semiconductor devices into individual semiconductor devices. As a wafer dividing apparatus, a dicing apparatus is generally used in which a hub blade with a thickness of approximately 10 to 30 μm cuts streets for cutting the wafer while rotating at a high-speed of 30,000 rpm or more. However, a laser processing apparatus is also used other than the dicing apparatus. The laser processing apparatus emits laser beams along streets and employs a technique for directly cutting a wafer by laser beam irradiation or for irradiating the inside of a wafer with a laser beam to form a modifying layer and dividedly cutting the modified portion.

In the case of dividing a wafer using the laser processing apparatus, if a laser beam is directed to a street from the front surface side formed with devices, a problem is likely to occur as below. A fused material called debris splashes or flows and adheres to the surface of a device or a laser beam impinges on a TEG which is a metal test pattern formed on the front surface side of a street. To eliminate such a problem, a technique for directing a laser beam to a wafer from the rear surface side thereof is proposed in Japanese Patent Laid-open No. 2004-22936.

It is necessary to recognize the positions of streets in order to emit laser beams along the streets. The recognition method includes the following example. Infrared light is directed to a wafer from the rear surface thereof. Light reflected by the wafer rear surface is received by a microscope installed on the rear surface side of the wafer to provide an image. Streets are recognized from the pattern image of the wafer front surface thus obtained. However, in this method, infrared light is diffusely reflected by a wafer such as the so-called epitaxial wafer doped with boron or the like or by a wafer that is variously doped or thermally-treated by the previous process. It is sometimes difficult to obtain the accurate pattern image of the front surface, which consequently produces a problem in that the wafer cannot accurately be cut along the streets.

SUMMARY OF THE INVENTION

Accordingly, it is an object of the present invention to provide a wafer dividing method and apparatus in which when a wafer is cut along streets on the rear surface thereof by laser beam irradiation, even if the wafer is variously doped or thermally-treated, the pattern image of the front surface of the wafer can accurately be obtained so that the streets can accurately be cut.

In accordance with an aspect of the present invention, there is provided a wafer dividing method of dividing a wafer along lattice-like streets into a plurality of individual devices by laser processing means, the wafer being sectioned by the streets into the devices on the front surface thereof, the method including: a wafer holding step for allowing holding means to hold the wafer with the rear surface side thereof opposed to the laser processing means; an electromagnetic irradiation step for emitting an electromagnetic wave which can penetrate the wafer, to the front surface side of the wafer held by the holding means; a street detection step for detecting the streets on the basis of an image formed by the electromagnetic wave that has penetrated the wafer; and a wafer processing step for processing the wafer along the streets by allowing the laser processing means to emit a laser beam from the wafer rear surface to the streets detected in the street detection step. Preferably, an infrared ray or an X-ray is mainly used as the electromagnetic wave of the present invention.

According to the wafer dividing method of the present invention, an electromagnetic wave such as an infrared ray, an X-ray or the like having a wavelength that can penetrate the wafer is emitted to the wafer from the front surface side of the wafer held by the holding means with the rear surface side opposed to the laser processing means, thereby detecting the penetrating image as a pattern image of the wafer front surface. An image sensor applicable to an electromagnetic wave is used to detect the image. For example, if the electromagnetic wave is an infrared ray, an infrared camera or an infrared microscope is applicable thereto. The streets are detected from the pattern image of the wafer front surface detected by the image sensor. The laser processing means emits a laser beam from the rear surface side of the wafer along the streets detected. In this way, all the streets are subjected to the processing such as cutting or the like, whereby the wafer is divided into a plurality of devices.

The present invention is characterized in that an electromagnetic wave is emitted to the front surface side of the wafer and the streets are detected based on the penetrating image of the electromagnetic wave. The present invention is not such that the streets are detected based on a reflecting image of an infrared ray emitted from the rear surface side of the wafer as in the conventional way. Thus, even if a wafer is variously doped or thermally-treated, the pattern image of the front surface of the wafer can accurately be obtained, whereby the streets can accurately be cut.

In accordance with another aspect of the present invention, there is provided a wafer dividing apparatus which includes: holding means for holding the wafer with the rear surface side opposed to the laser processing means; alignment means for detecting the streets of the wafer held by the holding means; and laser processing means for processing the streets by emitting a laser beam to the streets detected by the alignment means; wherein the alignment means includes: electromagnetic irradiation means for emitting an electromagnetic wave that can penetrate the wafer, to the rear surface side of the wafer held by the holding means; and street detection means for capturing the electromagnetic wave that has been emitted from the electromagnetic irradiation means and has penetrated the wafer and for detecting the streets on the basis of an image formed by the penetrating electromagnetic wave.

In the present invention, the electromagnetic wave emitted from the electromagnetic irradiation means is preferably an infrared ray or an X-ray. For the infrared ray, an optical sensor such as an infrared microscope or the like is used as the street detection means. For the X-ray, an appropriate X-ray sensor is used as the street detection means.

According to the present invention, the streets are detected based on the penetrating image of the electromagnetic wave emitted to the wafer from the wafer front surface side. Even if the wafer is variously doped or thermally-treated, the streets can accurately be detected. Thus, there is provided an effect that operation for emitting a laser beam to the streets from the wafer rear surface side for cutting can accurately be performed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

An embodiment according to the present invention will hereinafter be described with reference to the drawings.

[1] Semiconductor Wafer

Figure 1:
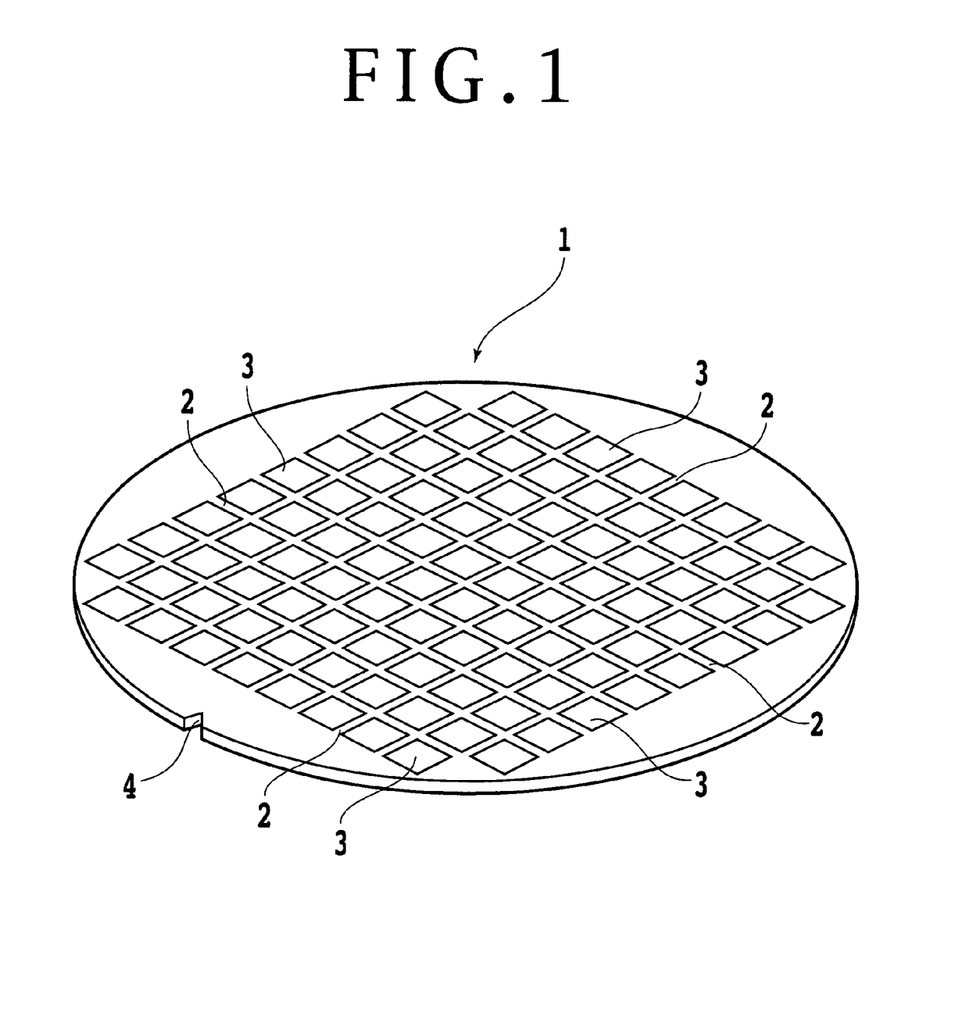
FIG. 1 is a perspective view of a semiconductor wafer to be divided into a plurality of semiconductor chips according to an embodiment of the present invention.

FIG. 1 illustrates a disklike semiconductor wafer (hereinafter abbreviated as the wafer) which is made of single crystal silicon and whose entire rear surface is ground to reduce the thickness of the wafer to a predetermined thickness (e.g. from approximately 200 μm to 50 μm). A plurality of rectangular semiconductor chips (devices) are sectioned along lattice-like streets 2 on the front surface of the wafer 1. Electronic circuits such as ICs or LSIs not shown are formed on the front surface of the semiconductor chips 3. A V-shaped notch 4 indicating the crystal orientation of the semiconductor is formed at a predetermined position on the circumferential surface of the wafer 1. The wafer 1 is dividedly cut along the streets by a laser processing apparatus of the present embodiment shown in FIG. 2 into a plurality of individual semiconductor chips 3.

[2] Configuration of a Laser Processing Apparatus (Dividing Apparatus)

Figure 2:
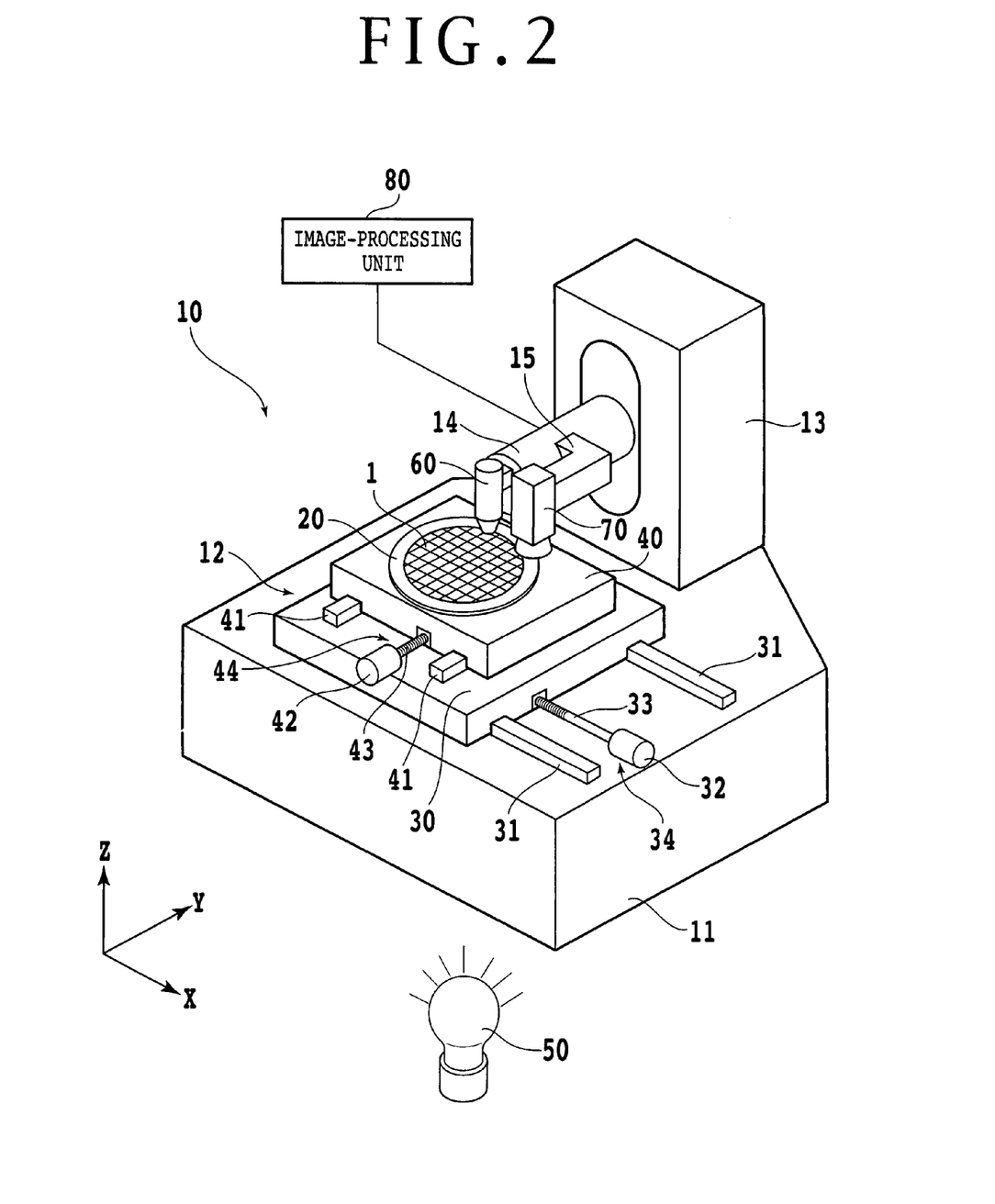
FIG. 2 is an overall perspective view of a laser processing apparatus according to an embodiment of the present invention.

A laser processing apparatus 10 shown in FIG. 2 has a base 11 with a horizontal upper surface. An XY movement table 12 is installed on the base 11 so as to be movable in horizontal X-axial and Y-axial directions. A disklike processing table (holding means) 20 is horizontally installed on the XY movement table 12. The wafer 1 is held on the processing table 20 with the rear surface thereof exposed to the upside and is divided into individual semiconductor chips 3 by a laser beams emitted vertically downwardly from a laser head (laser processing means) disposed above the wafer 1.

The XY movement table 12 is composed of a combination of an X-axis base 30 provided on the base 11 so as to be movable in the X-axial direction and a Y-axis base 40 provided on the X-axis base 30 so as to be movable in the Y-axial direction. The X-axis base 30 is slidably mounted on a pair of parallel guide rails 31, 31 which are secured onto the base 11 so as to extend in the X-axial direction. The X-axis base 32 is moved in the X-axial direction by an X-axis drive mechanism 34 which causes a motor 32 to operate a ball screw 33.

The Y-axis base 40 is slidably mounted to a pair of parallel guide rails 41, 41 which are secured onto the X-axis base 30 so as to extend in the Y-axial direction. The Y-axis base 40 is moved in the Y-axial direction by a Y-axis drive mechanism 44 which causes a motor 42 to operate a ball screw 43. The processing table 20 is turnably or stationarily installed on the Y-axis base 40 and is moved in the X-axial or Y-axial direction along with the movement of the X-axis base 30 or Y-axis base 40.

Figure 3:
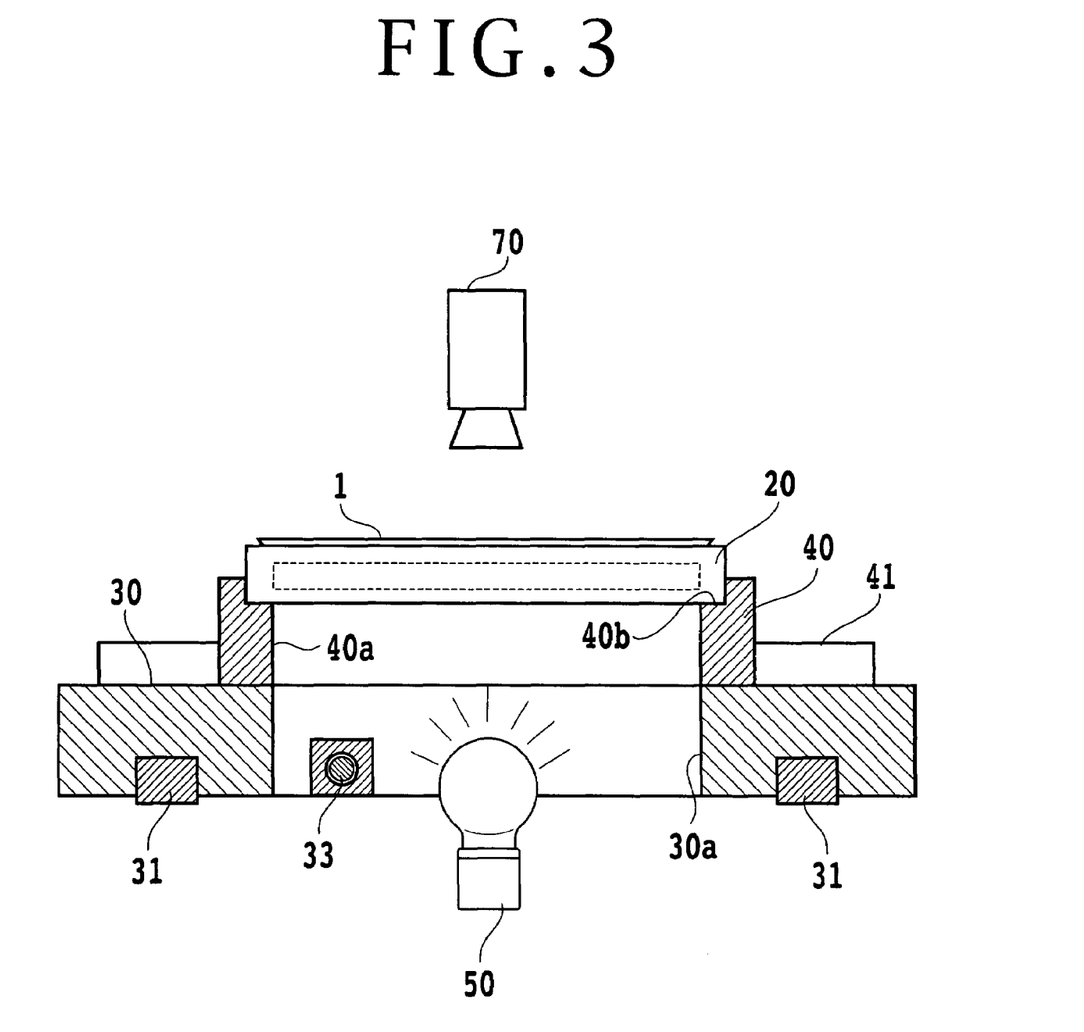
FIG. 3 is a partial cross-sectional lateral view illustrating the positional relationship among an XY movement table, a processing table, an infrared light source and an infrared microscope included in the laser processing apparatus according to the embodiment.

Referring to FIG. 3, the X-axis base 30 and the Y-axis base 40 are respectively formed with openings 30a and 40a at their respective central portions in such a manner that the openings 30a, 40a vertically open to communicate with each other. In addition, although not shown, a void is formed in the base 11 under the openings 30a, 40a. In the void an infrared light source (electromagnetic irradiation means) 50 is disposed which emits infrared light upward. The infrared light source 50 is supported by the base 11 via a bracket not shown.

Figure 4:
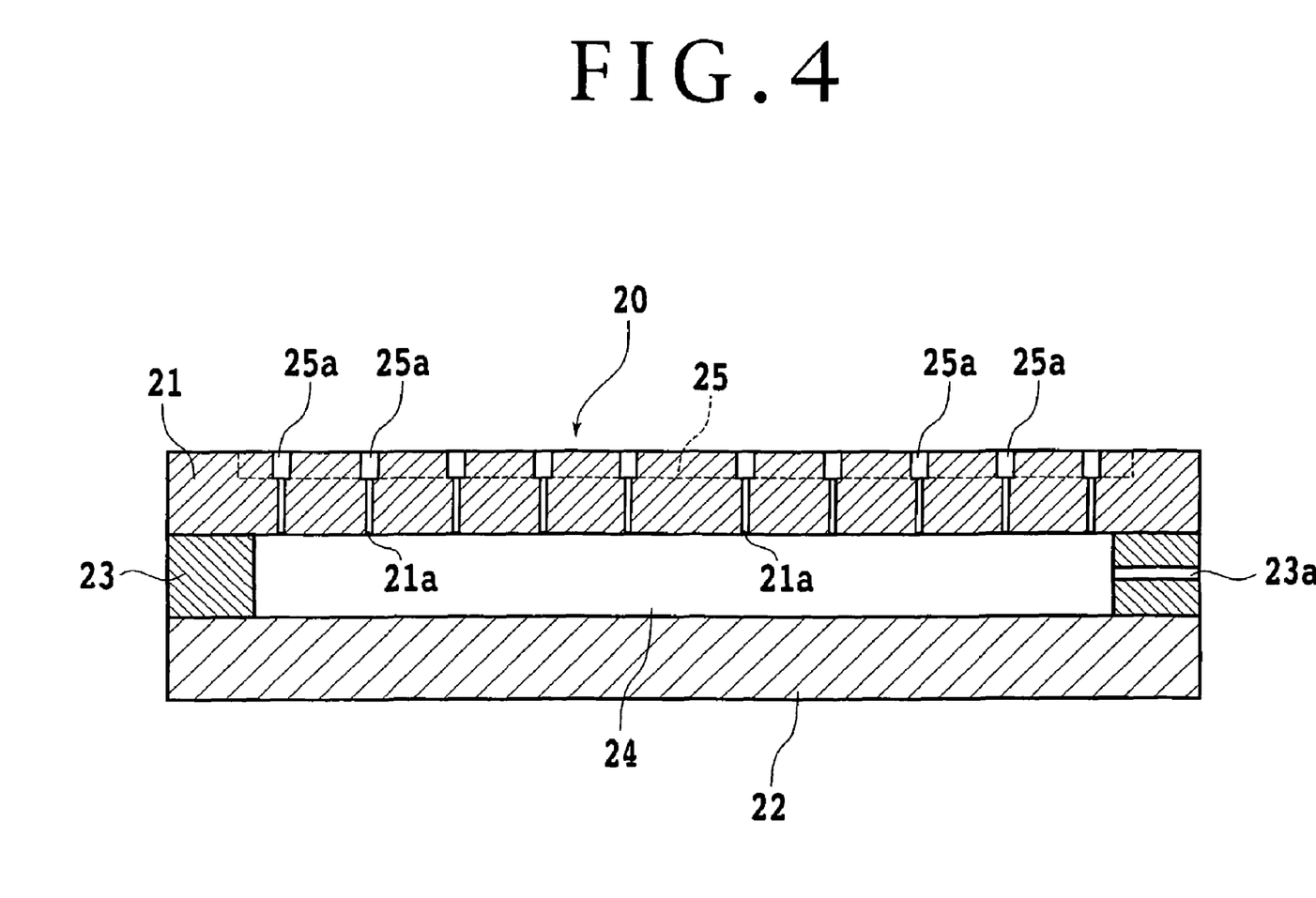
FIG. 4 is a cross-sectional view of the processing table.

The processing table 20 is of a vacuum chuck type and, as shown in FIG. 3, is fixedly fitted to a stepped portion 40b formed on the opening circumference of the upper surface of the Y-axis base 40. Referring to FIG. 4, the processing table 20 includes upper and lower plate portions 21, 22 and an annular circumferential wall portion 23 which connects the upper and lower plate portions 21 and 22 to define a vacuum chamber 24 therein. The upper plate portion 21 is formed with a suction area 25 adapted to suck the wafer 1 on the upper surface thereof by vacuum operation.

The suction area 25 is formed in the upper surface thereof with uniformly existing grooves 25a. Further, the upper plate portion 21 is formed with a plurality of suction passages 21a which causes the grooves 25 to communicate with the vacuum chamber 24. The grooves 25a are formed to accurately suck the entire to-be-sucked surface (in this case, the front surface formed with the semiconductor chips 3 thereon) of the wafer 1. For example, the grooves 25a are formed as a plurality of concentric grooves or lattice-like grooves. However, holes formed in a circle or in other shapes may be applicable instead of the grooves.

The circumferential wall portion 23 is formed with at least one vacuum suction port 23a, which is connected to a compressor not shown sucking the air in the vacuum chamber 24. The compressor is operated to suck the air in the vacuum chamber 24 from the vacuum suction port 23a, whereby air above the suction area 25 is sucked into the vacuum chamber 24 through the grooves 25a and suction passages 21a. In this vacuum operation state the wafer 1 is placed on, sucked and held by the suction area 25. In the processing table 20, at least the upper and lower plate portions 21, 22 are made of a material (e.g. glass) that transmits light from the light source 50.

As shown in FIG. 2, a column 13 is secured on the upper surface of the base 11 at a desired position on the periphery of the XY movement table 12 so as to extend upward in the vertical direction (the Z-axial direction). A tubular processing shaft 14 is provided for the column 13 so as to extend along the Y-axial direction to a position above the processing table 20. The processing shaft 14 is provided to be movable up and down along the column 13 and is moved up and down by a vertical-drive mechanism not shown housed in the column 13. The laser head 60 is attached to the leading end of the processing shaft 14.

A laser oscillator not shown such as a YAG laser oscillator or the like is connected to the laser head 60. Laser oscillated by the laser oscillator is emitted as a laser beam vertically downwardly from the laser head 60. The laser oscillated by the laser oscillator is of a type suitable to cut a wafer. Examples of laser preferably used include one having characteristics: a power of 1 to 5 W and a wavelength of 1064 nm.

An infrared microscope 70 having a light axis extending toward the vertical downside is disposed on one side of the processing shaft 14 extending in the Y-axial direction. The infrared microscope 70 is attached to the processing shaft 14 via an L-shaped arm 15 and moved up and down together with the laser head 60 along with the upward and downward movement of the processing shaft 14. The infrared microscope 70 captures a penetrating image or a pattern image of the wafer surface which penetrates the wafer 1 held by the processing table 20, by irradiation from the infrared light source 50. The pattern image of the wafer surface thus capture is loaded into an image-processing unit (street detecting means) 80 for detecting streets 2 to be cut. In the present embodiment, the infrared light source 50, the infrared microscope 70 and the image processing unit 80 constitute alignment means for detecting the streets 2 of the wafer 1 according to the present invention.

[3] Operation of the Laser Processing Apparatus

The laser processing apparatus 10 of the present embodiment is configured as above. A description is next made of operation of dividedly cutting the wafer 1 along the streets 2 by the laser processing apparatus 10.

The vacuum table 20 is first vacuum-operated to suck the front surface (the surface formed with the semiconductor chips 3 thereon) of the wafer 1 on the suction area 25 of the processing table 20, holding the wafer 1 on the processing table 20 with the rear surface thereof exposed (holding step). To protect the semiconductor chips 3, a transparent protection tape may be stuck on the front surface of the wafer 1.

Next, the XY movement table 12 is appropriately moved in the X-axial and Y-axial directions to bring the wafer 1 into the field of the infrared microscope 70 and infrared light is directed from the infrared light source 50 to the front surface side of the wafer 1 (electromagnetic irradiation step). The infrared light passes through the respective openings 30a, 40a of the X-axis base 30 and Y-axis base 40, penetrating the upper and lower plate portions 21, 22 of the processing table 20, and further penetrates the wafer 1 from the front surface side toward the rear surface thereof.

Figure 5:
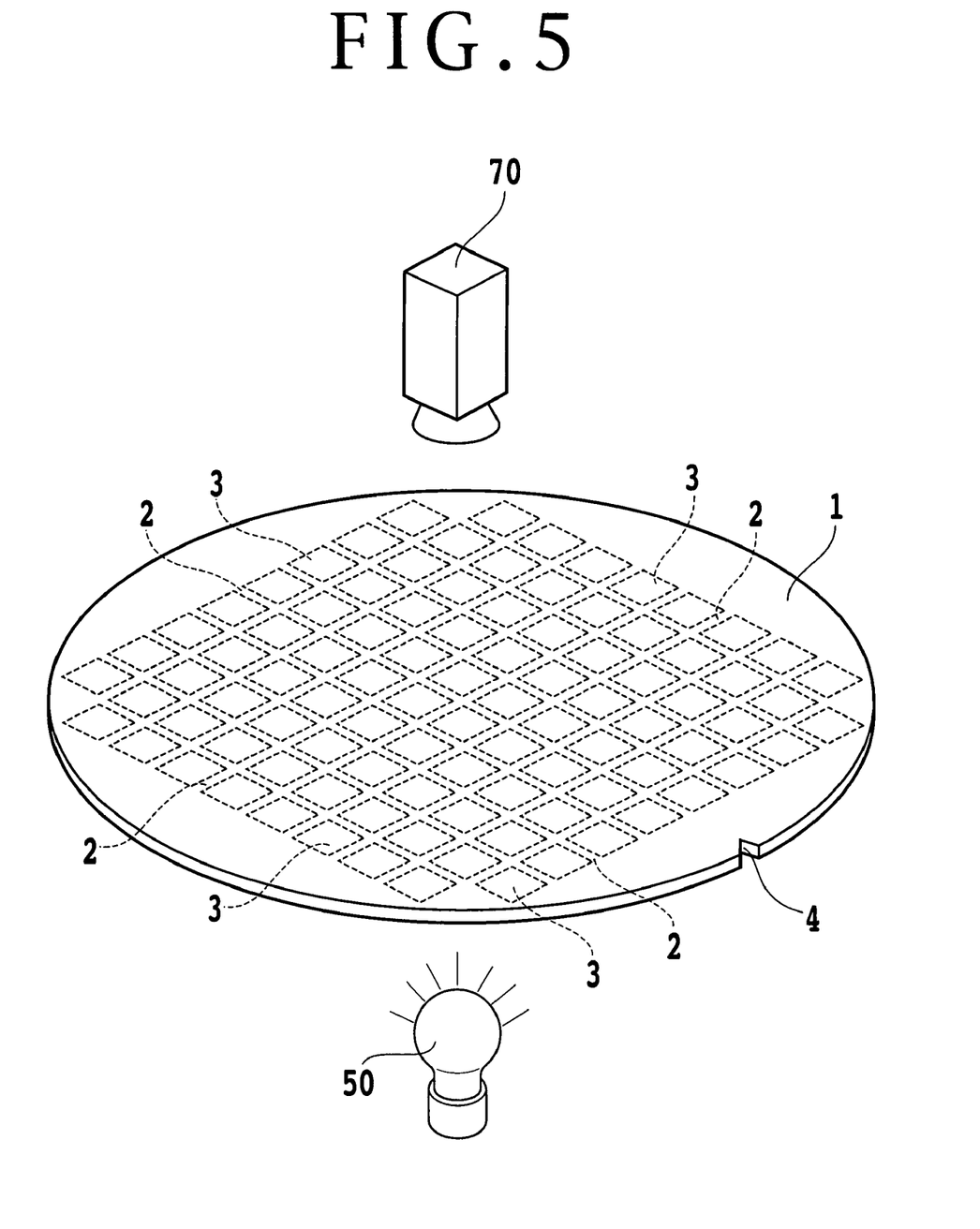
FIG. 5 is a perspective view imaginarily illustrating a state where an image resulting from infrared light penetrating the wafer is captured by the infrared microscope.

The processing shaft 14 is then moved up and down to adjust the height of the infrared microscope 70 for bringing the infrared microscope 70 into focus on the rear surface of the wafer. Thus, the infrared microscope 70 captures an image which is infrared light penetrating the wafer 1. FIG. 5 illustrates the image-capturing state imagined. The penetrating image resulting from the infrared light is a pattern image including a circuit pattern used to detect the streets 2 in addition to the electronic circuit of the semiconductor chip 3. The pattern image is loaded into the image processing unit 80, which detects the streets 2 based on the pattern image (street detection step).

The processing shaft 14 is moved up and down to adjust the height of the laser head 60 relative to the wafer 1 to a position suitable for laser processing. While the wafer 1 is moved in the X-axial and Y-axial directions by appropriately combining the X-axial movement of the X-axis base 30 with the Y-axial movement of the Y-axis base 40 so that a laser beam can be directed along the streets 2 detected by the image processing unit 80, the laser beam is emitted to the streets 2 from the laser head 60 (wafer processing step).

The laser processing in this case is processing for cutting the streets 2, which processing involves cutting the wafer 1 so as to pass through the thickness thereof. In the case of cutting processing, a tape such as the protection tape mentioned above is preliminarily stuck on the front surface of the wafer 1 in order to prevent the plurality of individual semiconductor chips 3 from splashing and to enable handling thereof.

Figure 6:
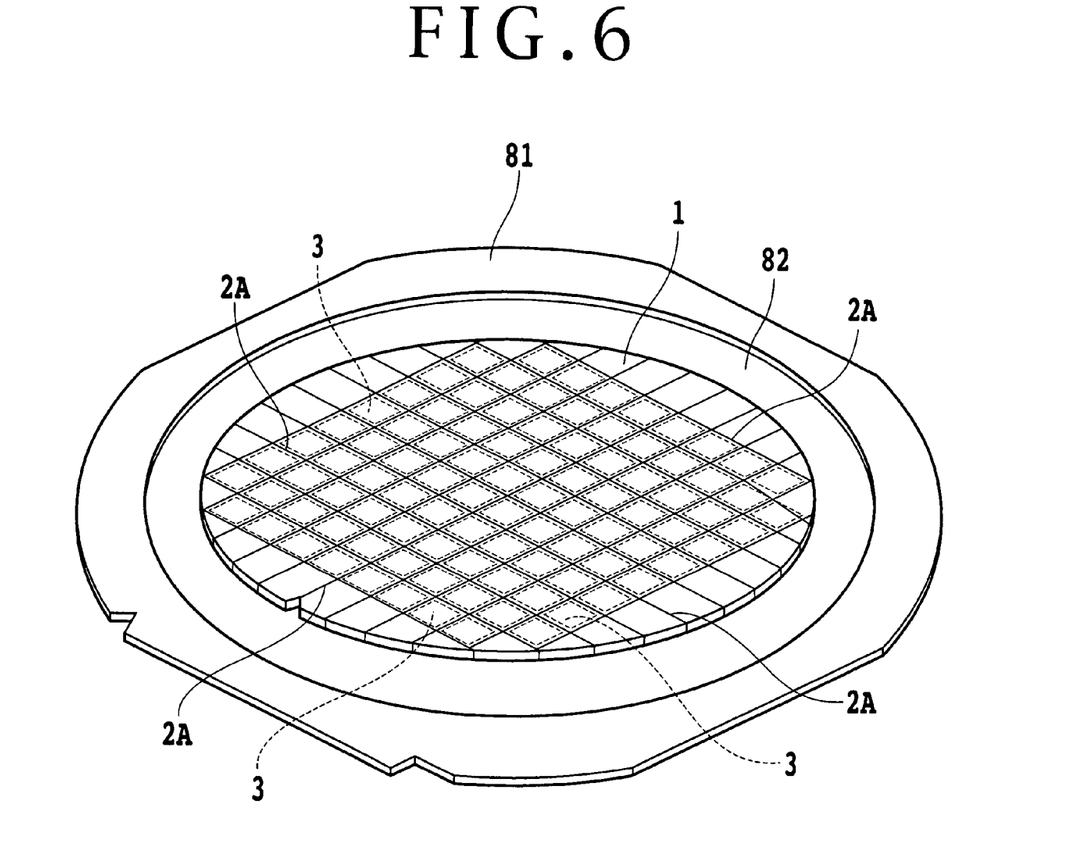
FIG. 6 is a perspective view of a wafer in which a modifying layer is formed inside streets by laser beam irradiation and thereafter the wafer is dividedly cut along the streets into individual semiconductor chips.

The laser processing includes grooving processing for forming a groove, and formation of a modifying layer in which a laser beam is focused on the inside of the wafer 1 to make an irradiated portion fragile, in addition to the cutting processing. In any processing, after the laser processing, the streets 2 are dividedly cut by a breaking device or the like to provide individual semiconductor chips 3. FIG. 6 illustrates the wafer 1 in which after the modifying layer is formed, the wafer 1 is stuck to a dicing tape 82 with a dicing frame 81 and the streets 1 are dividedly cut to provide the individual semiconductor chips 3. In FIG. 6, solid lines 2A denote portions (slits) cut along the streets 2.

According to the present embodiment described above, infrared light is directed to the wafer 1 from the front surface side thereof to penetrate to the rear surface side of the wafer 1, the streets 2 are detected from the penetrating image and a laser beam is directed from the rear surface side of the wafer to the streets 2 thus detected. In other words, the streets 2 are not detected from the image reflected from the wafer rear surface. Thus, even if the wafer 1 is variously doped or thermally-treated, the pattern image of the wafer front surface and the streets 2 can accurately be obtained, whereby the streets 2 can accurately be cut.

In addition, since a laser beam is directed to the wafer 1 from the rear surface side thereof, debris resulting from the laser beam irradiation will not adhere to the front surface of the semiconductor chip 3, thereby enabling sound cutting. If a TEG is formed on the front surface side of the streets 2, since a laser beam is not reflected to the TEG, the streets 2 can accurately be cut.

While the embodiment described above employs infrared light as an electromagnetic wave in the present invention, other electromagnetic waves such as an X-ray or the like may be employed instead of the infrared light. For the X-ray, an appropriate X-ray sensor which captures an X-ray penetrating the wafer 1 is used instead of the infrared microscope 70. The image pattern of the wafer front surface detected by the X-ray sensor is loaded into the image processing unit 80.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer dividing method of dividing a wafer along lattice-like streets into a plurality of individual devices by laser processing means, the wafer being sectioned by the streets into the devices on the front surface thereof, the method comprising:
 a wafer holding step for allowing holding means to hold the wafer with a rear surface side thereof opposed to the laser processing means;

an electromagnetic irradiation step for emitting an electromagnetic wave, which can penetrate the wafer, onto the front surface side of the wafer to form an image of the streets on the rear surface side;

a street detection step for detecting the streets from the rear surface side of the wafer on the basis of the image formed on the rear surface side by the electromagnetic wave that has penetrated the wafer; and a wafer processing step for emitting a laser beam from the laser processing means onto the rear surface side of the wafer along the streets detected in the street detection step.

2. The wafer dividing method according to claim 1, wherein the electromagnetic wave is an infrared ray or an X-ray.

3. A wafer dividing apparatus which divides a wafer along lattice-like streets into a plurality of individual devices, the wafer being sectioned by the streets into the devices on the front surface thereof, comprising:

holding means for holding the wafer with the rear surface side thereof opposed to the laser processing means;

alignment means for detecting the streets of the wafer from the rear surface side of the wafer; and the laser processing means for emitting a laser beam from the laser processing means onto the rear surface side of the wafer along the streets detected by the alignment means;

wherein the alignment means includes:

electromagnetic irradiation means for emitting an electromagnetic wave that can penetrate the wafer, to the front surface side of the wafer to form an image of the streets on the rear surface side; and street detection means for capturing the electromagnetic wave that has been emitted from the electromagnetic irradiation means and has penetrated the wafer from the front surface side to the rear surface side, and detecting the streets from the rear surface side of the wafer on the basis of the image formed by the penetrating electromagnetic wave.

4. The wafer dividing apparatus according to claim 3, wherein the electromagnetic wave emitted by the electromagnetic irradiation means is an infrared ray or an X-ray.

* * * * *